United States Patent
McElhinney et al.

(10) Patent No.: US 6,590,920 B1
(45) Date of Patent: Jul. 8, 2003

(54) SEMICONDUCTOR LASERS HAVING SINGLE CRYSTAL MIRROR LAYERS GROWN DIRECTLY ON FACET

(75) Inventors: Mark McElhinney, White Bear Lake, MN (US); Paul Colombo, St. Paul, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 09/168,600

(22) Filed: Oct. 8, 1998

(51) Int. Cl.[7] .................................................. H01S 5/00
(52) U.S. Cl. ........................................................ 372/49
(58) Field of Search ............................... 372/49, 45, 46

(56) References Cited

U.S. PATENT DOCUMENTS

| | | | |
|---|---|---|---|
| 4,337,443 A | 6/1982 | Umeda et al. .................. 372/49 |
| 4,718,069 A | 1/1988 | Streifer et al. ................. 372/50 |
| 4,719,634 A | 1/1988 | Streifer et al. ................. 372/46 |
| 4,731,792 A | 3/1988 | Shimizu et al. ................ 372/49 |
| 4,815,084 A | 3/1989 | Scifres et al. .................. 372/49 |
| 4,828,935 A | 5/1989 | Jonker et al. ................. 428/642 |
| 4,856,013 A | * 8/1989 | Iwano et al. ................... 327/45 |
| 4,879,725 A | 11/1989 | Kawanishi et al. ............ 372/48 |
| 4,901,328 A | 2/1990 | Matsui et al. .................. 372/46 |
| 4,940,672 A | 7/1990 | Zavracky ....................... 438/23 |
| 5,022,037 A | 6/1991 | Kawanishi et al. ............ 372/49 |
| 5,063,173 A | 11/1991 | Gasser et al. .................. 438/38 |
| 5,144,634 A | 9/1992 | Gasser et al. .................. 372/49 |
| 5,144,635 A | 9/1992 | Suhara .......................... 372/49 |
| 5,171,717 A | 12/1992 | Broom et al. .................. 438/33 |
| 5,208,468 A | 5/1993 | Kawanishi et al. ............ 372/49 |
| 5,228,047 A | 7/1993 | Matsumoto et al. ........... 372/45 |
| 5,260,231 A | 11/1993 | Kawanishi et al. ............ 438/38 |
| 5,280,535 A | 1/1994 | Gfeller et al. ................. 372/46 |
| 5,404,027 A | 4/1995 | Haase et al. ................... 372/45 |
| 5,665,637 A | 9/1997 | Chand .......................... 372/46 |

FOREIGN PATENT DOCUMENTS

| | | |
|---|---|---|
| EP | 0 388 149 A3 | 9/1990 |
| EP | 0 477 033 A2 | 3/1992 |
| EP | 0 774 809 A1 | 5/1997 |
| GB | 2 195 822 | 4/1988 |
| JP | 55-27474 | 7/1980 |
| JP | 59039082 | 3/1984 |
| JP | 60113983 | 6/1985 |
| JP | 63-308992 | 12/1988 |
| JP | 01033987 | 2/1989 |
| JP | 64-33987 | 2/1989 |
| JP | 1-102982 | 4/1989 |
| JP | 1-227485 | 9/1989 |

OTHER PUBLICATIONS

Casey, Jr. et al, Heterostructure Lasers: Part B: Materials and Operating Characteristics, New York: Academic Press, 1978, p. 12. (no month available), 1978.*

Botez, D. et al., "Nonabsorbing–Mirror (NAM) CDH–LOC Diode Lasers", *Electronics Letters*, 20(13):530–531 (Jun. 21, 1984).

(List continued on next page.)

*Primary Examiner*—Quyen Leung
(74) *Attorney, Agent, or Firm*—Kagan Binder, PLLC

(57) ABSTRACT

A semiconductor laser with improved device characteristics and novel protection against high power output degradation is disclosed. The laser comprises a plurality of layers deposited on a substrate, including an active layer with neighboring cladding layers, so as to define a waveguide, said waveguide having opposing end surfaces. A single crystal mirror layer is formed directly on at least one of the end surfaces, providing improved device characteristics and a longer life time for high power output applications. The mirror layer has sufficient thickness and is made of a material having a refractive index sufficiently different from that of the active layer to substantially modify the reflectivity of the first end surface. In a preferred embodiment, the laser is an AlGaAs laser designed to operate at 980 nm, and the single crystal mirror layer comprises a large band gap material, such as ZnSe, MgS, or BeTe.

35 Claims, 4 Drawing Sheets

OTHER PUBLICATIONS

Itaya, K. et al., "Development of InGaAlP Inner Stripe Lasers (IV)–Aging Characteristics", 31a–ZP–4, (with English translation) No date available.

Itaya, K. et al., "Effect of Facet Coating on Reliability of InGaAlP Visible Laser Diodes", 31a–ZP–5, (with English translation) No date available.

Ko, H.C. et al., "Effect of cleaving environment on the growth of ZnSe on the GaAs (110) surface by molecular beam epitaxy", *J. Mat. Sci. Lett.*, 16:1187 (1987) (No month available).

Nannichi, Y. et al., "A Model to Explain the Effective Passivation of the GaAs Surface by $(NH_4)_2S_x$ Treatment", *Japanese Journal of Applied Physics*, 27(12):L2367–L2369 (Dec. 1988).

Sasaki, K. et al., "Highly Reliable 150 mW CW Operation of Single—Stripe AlGaAs Lasers with Window Grown on Facets", *Japanese Journal of Applied Physics*, 30(5B):L904–L–906 (May 1991).

Ungar, J. et al., "High–Power GaAlAs Window Lasers", *Lasers & Applications*, pp. 111–114 (Sep. 1985).

Yamamoto, S. et al., "Visible GaAlAs V—channeled substrate inner stripe laser with stabilized mode using p—GaAs substrate", *Appl. Phys. Lett.*, 40(5):372–374 (Mar. 1, 1982).

\* cited by examiner

SEMICONDUCTOR LASERS HAVING SINGLE CRYSTAL MIRROR LAYERS GROWN DIRECTLY ON FACET

FIELD OF THE INVENTION

This invention relates generally to semiconductor lasers having a multilayer structure deposited on a substrate so as to define a waveguide, wherein laser light is emitted out one end surface of the laser. More particularly, the invention relates to semiconductor lasers having single crystal mirror structures deposited directly on at least one end surface of the lasers.

BACKGROUND OF THE INVENTION

In recent years, semiconductor lasers have found a number of technological applications, including optical communications systems, optical disc drives, and laser printers. Such semiconductor lasers typically are formed as a multilayer structure on a substrate, including an active layer surrounded by two cladding layers. The end surfaces of the multilayer structure, referred to herein as the "facet mirror," typically have a reflectivity in the range of 30%. Thus, mirror stacks, typically made of alternating layers of two or more amorphous materials, are applied to each facet mirror in differing thicknesses so as to adjust the reflectivity of one laser facet to about 95% and the other laser facet to about 5%. Common lasers used in the telecommunications industry are AlGaAs lasers that produce light in the 980 nm region.

Many of the applications for semiconductor lasers require operation of the lasers at high power outputs (typically above 30 mW) for extended periods of time. The operation of semiconductor lasers at high power outputs causes considerable dissipation of heat at the facet mirrors, which over time degrades these surfaces. This deterioration, termed catastrophic optical damage (COD) in the art, reduces the stability and lifetime of the semiconductor laser. Thus, the maximum power at which a semiconductor laser can be operated for extended periods of time is severely limited.

There are several known steps that can be taken to reduce the occurrence of COD. One known way to reduce the occurrence of COD is through the use of so-called "window layers." A window layer is a layer of material, applied to the facet mirrors, which has a higher band gap than the material forming the multilayer laser structure. The window layer is largely transparent to the laser light, and thus in effect lengthens the laser cavity, thereby reducing heat buildup (and consequently COD) at the facet mirrors.

Examples of such window layers are described in Botez, D., et al., "Nonabsorbing Mirror (NAM) CDH-LOC Diode Lasers", Electronics Letters, Jun. 21, 1984, pp. 530–31, and in U.S. Pat. No. 5,228,047. Both of these references disclose the use of $Al_zGa_{1-z}As$ as a window layer on an $Al_zGa_{1-z}As$ multilayer structure, wherein the stoichiometry of the AlGaAs window layer is adjusted so as to give the window layer a higher band gap than that of the multilayer structure. Because the window layer does not substantially modify the reflectivity of the multilayer structure, however, it is still necessary to add a mirror stack over the window layers to obtain the necessary reflectance. Moreover, both the window layer and the mirror stack absorb laser energy, thus reducing the output of the laser and increasing heat buildup in the laser.

Another known way to reduce the occurrence of COD is through application of a passivation layer to the facet mirrors. A passivation layer is a thin layer of material, typically less than 10 nm thick, which prevent contaminants from forming on the facet mirrors. For example, U.S. Pat. No. 5,144,634 discloses the use of a passivation layer made of Si, Ge or Sb, which is applied in situ so as to prevent oxidation of the laser facets. Once the passivation material is applied, the lasers can be safely removed from vacuum and a standard mirror stack applied.

Passivation layers of the type shown in U.S. Pat. No. 5,144,634 have several drawbacks. While relatively thin, the passivation layers nonetheless absorb laser energy, causing power dissipation and heat buildup at the facet mirror. Moreover, the passivation layer has a negligible effect on the reflectivity of the facet mirrors, and so requires a full mirror stack, which again typically causes additional heat buildup and power dissipation in the laser.

U.S. Pat. No. 5,665,637 discloses an improvement over U.S. Pat. No. 5,144,634 in that polycrystalline layers of large band gap materials, such as ZnSe and ZnS, are used as a passivation layer. Because the large band gap materials do not absorb as much light energy, such passivation layers reduce the amount of heat buildup at the facet mirror. However, because the material is polycrystalline, it still absorbs some energy. Therefore, to minimize absorption, passivation layers are designed to be as thin as possible, and thus do not obviate the need for traditional mirror stacks to be applied over the passivation layers.

Accordingly, the main objective of the present invention is to provide a semiconductor laser with a single crystal mirror layer deposited directly on the mirror facet, resulting in a device having improved protection against COD and improved device characteristics, including longer lifetimes, greater power outputs, and improved stability.

SUMMARY OF THE INVENTION

The present invention achieves the aforementioned objectives by providing a semiconductor laser comprising a plurality of layers deposited on a substrate, including an active layer with neighboring cladding layers, defining a waveguide, said multilayer structure further defining opposing facet mirrors. The semiconductor laser further includes a mirror stack comprising a base mirror layer formed directly on at least one of the facet mirrors, the base mirror layer being grown epitaxially as a single crystal layer. The base mirror layer has sufficient thickness, and is made of a material having a refractive index sufficiently different from that of the multilayer structure, to substantially modify the reflectivity of the facet mirrors. The use of the single crystal mirror layer eliminates the need for either a window layer or a passivation layer, and provides improved device characteristics, including greater power output, improved stability, and an extended lifetime.

The single crystal base mirror layer is preferably made of a material which has a high band gap relative to the materials making up the multilayer structure. This further reduces the absorption of laser energy by the mirror stack.

The base mirror layer should have a thickness that is on the order of $\lambda/4n$, where $\lambda$ is the wavelength of light that the laser is designed to operate at, and n is the refractive index of the material forming the base mirror layer. Thus, for example, for an AlGaAs communications laser designed to operate at 980 nm, the mirror layer is preferably made of a II–VI material such as ZnSe, MgS, or BeTe which is on the order of about 80–200 nm thick, and most preferably about 100 nm thick. The use of such a layer of high band gap material improves the laser's power output and protection against COD. Moreover, the material can be epitaxially grown on the multilayer structure at relatively low temperatures, thereby avoiding unnecessary heat damage to the preprocessed laser structure.

According to the present invention, the mirror stack(s) may include additional amorphous mirror layers deposited by known techniques so as to adjust the reflectivity of the laser to the desired levels. However, in a preferred embodiment of the invention, mirror stacks are applied to both facet mirrors, and the base mirror layer of one of the mirror stacks sufficiently modifies the reflectivity of one of the facet mirrors such that no additional mirror layers are required on that surface. In the most preferred embodiment of the invention, the other mirror stack contains additional mirror layers that are also grown epitaxially as single crystal layers.

As used herein, the term "refractive index sufficiently different . . . to substantially modify the reflectivity of the facet mirrors" means that the refractive index is at least 10% greater or less than that of the multilayer structure. In order to minimize the number of additional mirror layers that must be provided, it is preferred that the single crystal mirror layer have a refractive index that is at least 50% greater or less than that of multilayer structure.

A "single crystal" herein means a solid which is neither polycrystalline nor amorphous. Single crystal growth possesses several signatures, including: a well-defined x-ray diffraction rocking curve with a full width at half maximum of about <0.5° and a streaked reflection high energy electron diffraction (RHEED) pattern during growth. One skilled in the art will realize that the single crystals of this invention are not limited to materials characterized by the above exemplary probing methods.

A "large band gap" herein means an energy band gap at least ~0.3 eV larger than that of the active layer. As many active layers have band gaps ~<1.4 eV, the term "large band gap" corresponds to at least about 1.7 eV. It is known to one skilled in the art that this group comprises numerous materials, including ZnSe, MgS, BeTe, and ternary and quaternary combinations thereof.

DETAILED DESCRIPTION OF THE PREFERRED EMBODIMENT

Figure 1:
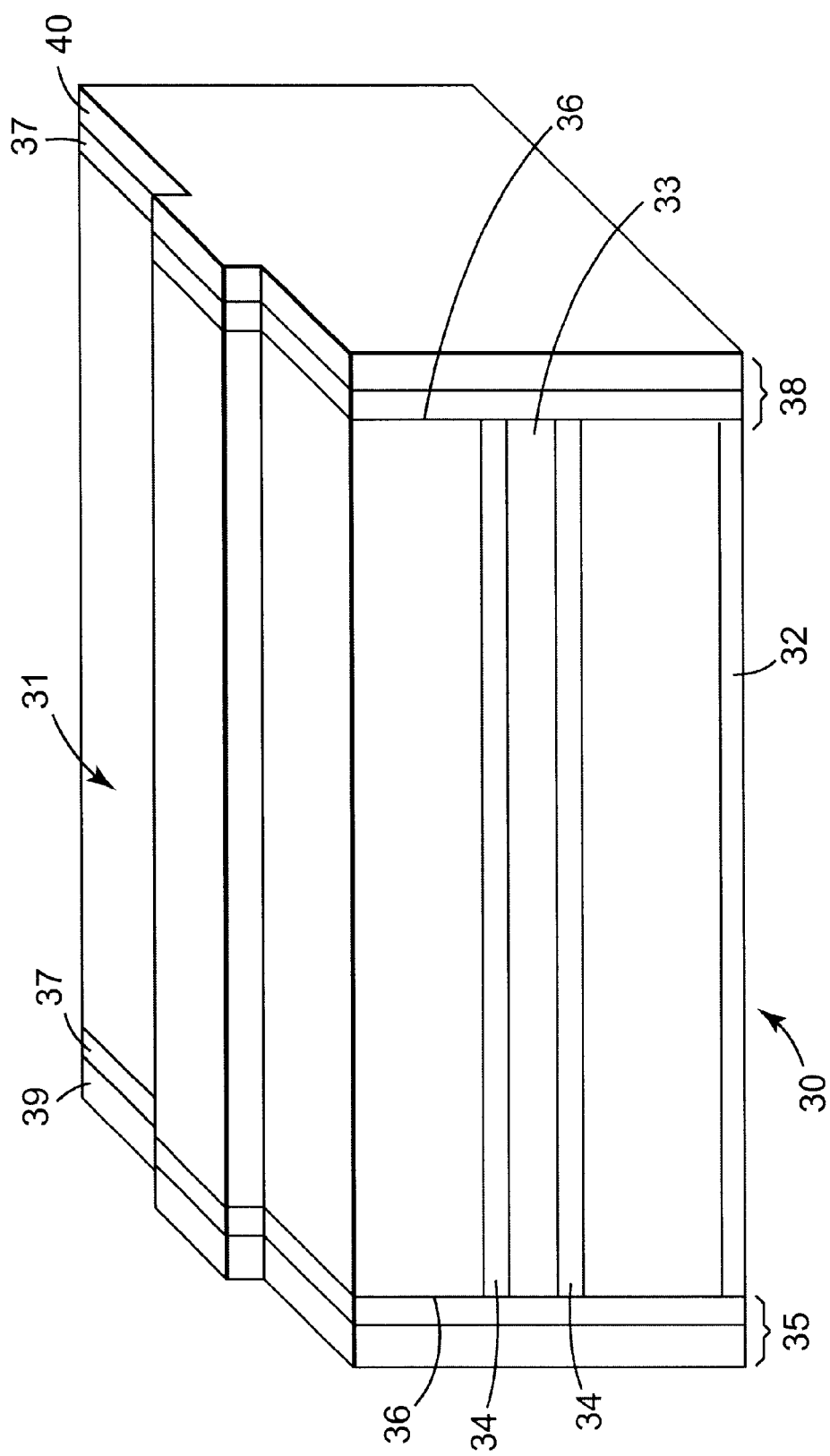
FIG. 1 shows a perspective view of a semiconductor laser made according to a preferred embodiment of the present invention.

A preferred embodiment of a semiconductor laser made according to a preferred embodiment of the present invention is shown in FIG. 1. As shown therein, the semiconductor laser 30 includes a multilayer structure 31 deposited on a substrate 32. The details of the multilayer structure 31 are not critical to the present invention, and thus will not be described in detail. However, the multilayer structure generally includes an optically active layer 33 surrounded by two cladding layers 34, so as to define a waveguide. After formation of the multilayer structure metallic contacts are applied to the top and bottom surfaces so as to create a preprocessed laser structure. The multilayer structure 31 further defines opposing end surfaces 36.

Mirror stacks 35 and 38 are formed on both end surfaces 36 of the multilayer structure. Preferably, both mirror stacks include a single crystal base mirror layer 37 formed directly on the laser end surfaces 36. Base mirror layers 37 are made of a material having an index of refraction sufficiently different from that of the multilayer structure to substantially modify the reflectivity of the end surfaces 36. The base mirror layers also are preferably made of a material having a large band gap, e.g., at least 300 meV larger than that of the active layer of the multilayer structure. Laser end surfaces 36 are preferably clean at the time mirror layers 37 are grown thereon, so as to facilitate single crystal growth and to reduce the presence of contaminants that can cause COD.

Mirror stacks 35 and 38 also may include additional mirror layers 39 and 40 formed on the base layers 37. Additional mirrors layers 39 and 40 are preferably of different reflectivity, so as to adjust the total reflectivity of mirror stack 35 to approximately 95%, and the total reflectivity of mirror stack 38 to approximately 10%. It should be noted that it is possible to achieve sufficient reflectivity of the low-reflectivity mirror stack 38 with mirror layer 37 alone, such that additional layer 40 may be omitted altogether.

In a particularly preferred embodiment, semiconductor laser 30 is a GaAs laser designed to produce 980 nm laser light. In this instance, the multilayer structure comprises a GaAs substrate, a GaAs buffer layer, AlGaAs cladding layers, and an InGaAs quantum well. The end surfaces of this multilayer structure constitute facet mirrors which, prior to coating, have a reflectivity of approximately 30%.

In this preferred construction, the base mirror layers 37 are made from the II–VI family of materials, such as ZnSe, MgS, and BeTe. Such materials have an index of refraction which is substantially different than that of the AlGaAs based substrate (2.52 for ZnSe compared to 3.66 for GaAs), and thus are suitable as mirror layers to adjust the reflectivity of the facet mirrors. Such materials are also preferred for formation of the single crystal mirror layers on GaAs lasers because of their large band gaps (ZnSe=2.67 eV, MgS=4.5 eV, and BeTe=2.8 eV). Large band gap materials such as these are highly non-absorbing to the laser light, providing excellent protection from localized facet heating, which can cause COD.

Materials such as ZnSe, MgS, and BeTe are also desirable because they provide a minimal lattice mismatch with GaAs, necessary for high quality single crystal growth. For example, the lattice mismatch between GaAs and ZnSe is 0.27%. This provides single crystal films with minimal crystalline defects, resulting in semiconductor lasers with improved device characteristics and enhanced protection against COD.

These materials are also desirable because they can be grown as a single crystal on the end surfaces of the multilayer structure at a relatively low temperature (<350° C.). The use of low temperatures reduces heat damage to the preprocessed laser structure, and also reduces the introduction of contaminants into the mirror layer 37 which might be caused by outgassing of other elements within the deposition chamber.

The preferred thickness for the base mirror layers 37 is $\lambda/4n$ thick, where $\lambda$ is the wavelength of the laser light, and n is the refractive index of the material making up layer 37.

Single crystal mirror layers of this thickness provide the maximum change in reflectivity of the facet mirrors. It may be desirable, however, to make the thickness of the mirror layers slightly greater or less than $\lambda/4n$, in order to adjust the reflectivity of the mirror layers to the desired level. Thus, the thickness of the mirror layers for a 980 nm laser will generally be in the range of 80–200 nm.

In this preferred construction, layer 40 of the low reflectivity mirror stack 38 may be omitted altogether, or may comprise a single layer of $SiO_2$ or $Si_3N_4$ in order to precisely tune the reflectivity to the desired value. Layer 39 of the high reflectivity mirror 35 may comprise a layer of $Si_3N_4$ followed by four alternating layers of $SiO_2$ and $Si_3N_4$. These layers may be grown amorphously over the layers in a manner well known in the art. In this preferred embodiment, layer 39 is $\lambda/4n$ thick and layer 40 is of a thickness sufficient to tune the mirror reflectivity by typically 1 or 2%.

Alternatively, layer 39 may comprise additional layers which are also grown epitaxially as single crystal layers over base layer 37. For example, if layers 37 are made of ZnSe, then layer 39 may be made up of alternating layers of BeTe and ZnSe sufficient to adjust the reflectivity to approximately 95%. By doing so, the heat absorption caused by the mirror stacks may be minimized.

Although the present invention greatly improves the device characteristics (e.g., power output, stability, and lifetime) of high power output 980 nm GaAs lasers, it is equally applicable to other GaAs lasers, and indeed to many other semiconductor lasers regardless of their operating power and wavelength. However, this invention provides the greatest benefit for high power output (e.g., $\geq 30$ mW) semiconductor lasers.

Single crystal growth generally requires clean end surfaces. "Clean surfaces" means herein surfaces with essentially no (e.g., $\leq 10$ atomic %) oxide or other contaminants. Semiconductor laser bars with clean end surfaces can be achieved in many ways, and this invention encompasses all such means. Known methods for producing clean end surfaces include either cleaving in vacuum or cleaving in air followed by end surface ion etching to remove the resulting oxide.

A preferred method of making the semiconductor lasers of the present invention is as follows. First, a laser cell containing the multilayer structure 31 is formed on a substrate. Such laser cells, as well as methods for growing the multilayer structure thereon, are well known in the art, and will not be described here. As is also known in the art, the laser cells are then cleaved into laser bars. Each of the laser bars is made up of a large plurality of the semiconductor lasers, with the side surfaces of the laser bars forming the exposed end surfaces 36 of the multilayer laser structure.

After cleaving, one or more laser bars may be transferred to a deposition chamber for application of the single crystal mirror layers 37. The deposition chamber is preferably an MBE (molecular beam epitaxy) chamber which, as those skilled in the art, generally includes a pump for reducing the chamber to UHV conditions, a holder to hold and manipulate the laser bar, and one or more effusion cells which contain the, raw materials that will make up mirror layer 37. To facilitate growth of a single crystal layer, means may be provided to heat the exposed end surface 36 of the laser bars to an elevated temperature of between 100° C.–650° C., depending on the material to be grown on the end surface. A single crystal layer of material is then grown on one or both end surfaces of the laser bar.

The epitaxial growth of layers 37 requires that the surfaces 36 are substantially contamination-free. This can be done either by cleaving under UHV conditions and maintaining the laser bars under UHV conditions after cleaving, or by cleaving in air followed by end surface ion etching prior to depositing the layers 37. Preferably, additional mirror layers 39 and 40 should also be grown epitaxially as single crystal layers directly over the layers 37. Alternatively the layers 39 and 40 may be applied amorphously by known techniques. In any event, once the mirror stack is deposited so as to adjust the reflectivity of the laser surfaces to the desired level, the laser bars can be cleaved into individual semiconductor lasers in a manner known in the art.

EXAMPLE

An exemplary batch of semiconductor lasers according to the preferred embodiment was made as follows. A laser cell comprising a multilayer AlGaAs structure designed to emit light at 980 nm was cleaved into a plurality of laser bars. The semiconductor laser bars were transferred to a nearby deposition chamber, protecting the clean laser bar end surfaces from exposure to atmospheric contaminants and also facilitating the ability to grow epitaxially on that surface. The laser bars were placed in front of a heater assembly in the deposition chamber so that the laser bar end surfaces were heated to about 250–350° C. by radiative heating, for optimal ZnSe single crystal growth. A single Knudson cell containing ZnSe was stabilized at 750° C., ensuring stable fluxes of Zn and Se at the heated semiconductor laser bar end surfaces. These cell temperatures were selected to achieve a growth rate of about 1 $\mu$m/hr.

Using these methods, a roughly 245 nm thick ZnSe single crystal mirror layer was grown on each of the heated laser bar end surface by MBE. The process was then repeated to grow similar single crystal ZnSe mirror layers on the opposing end surfaces. Following growth of the single crystal mirror layers on the opposing end surfaces of the plurality of semiconductor laser bars, the laser bars were removed from the deposition chamber. Thereafter, one end surface was coated with a single layer of $SiO_2$ so as to adjust the reflectivity to approximately 10%, while the other end surface was coated with three alternating layers, $\lambda/4n$ thick, of $SiO_2$ and Si so as to adjust the reflectivity to approximately 95%. These layers were applied by plasma enhanced chemical vapor deposition (PECVD). The laser bars were cleaved into individual semiconductor lasers in a manner known in the art.

Figure 2:
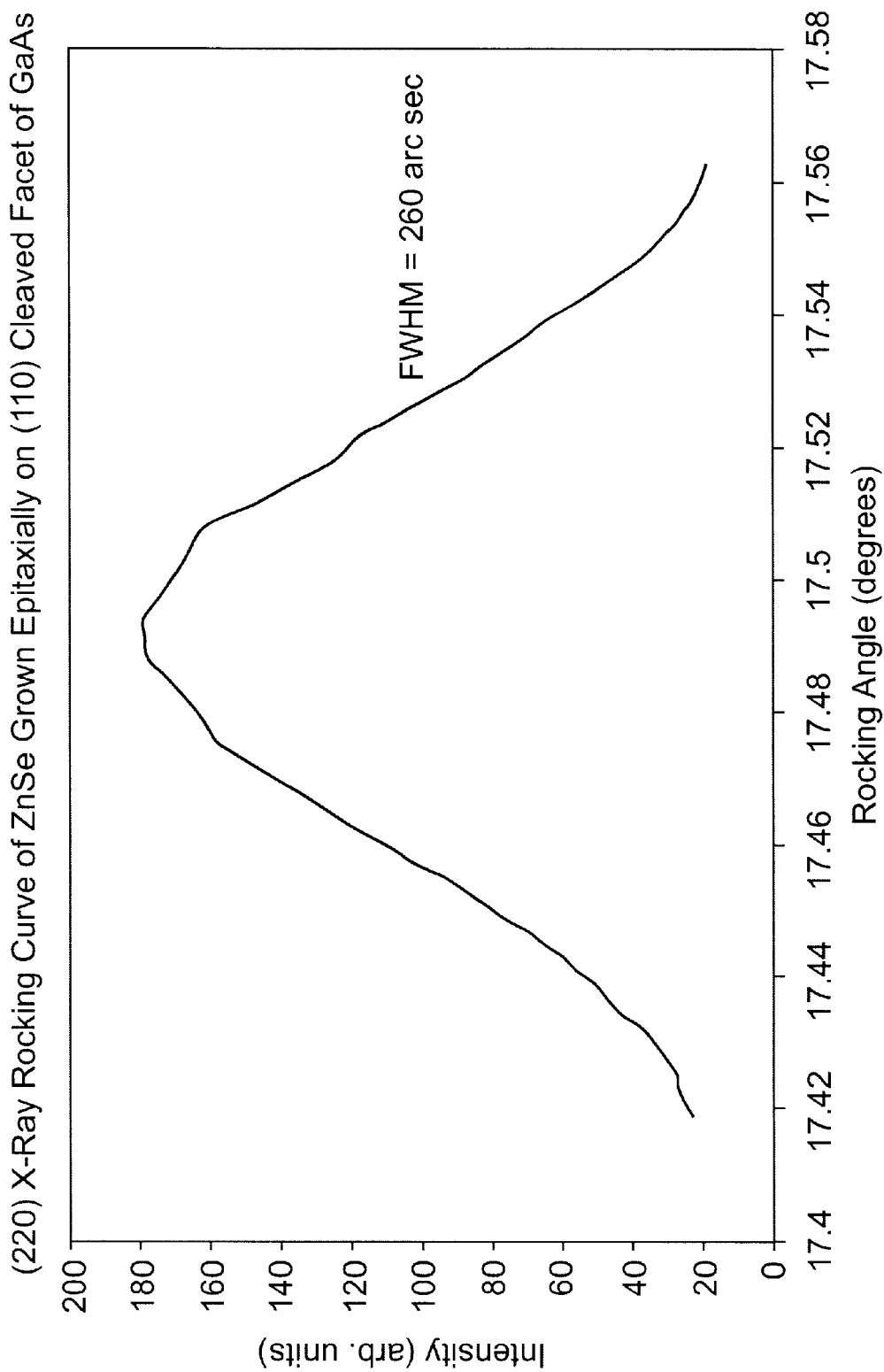
FIG. 2 shows an x-ray rocking curve, showing the crystalline characteristics of a mirror layer employed on semiconductor lasers made according to a preferred embodiment of the invention.

FIG. 2 is a graph showing the x-ray rocking curve of the resulting layers 37. This graph shows that the layers 37 are highly crystalline in nature, with low crystal defect density. This low defect density provided superior device characteristics and permitted growth of a non-absorbing mirror layer, resulting in excellent protection against COD.

One of the characteristics of the semiconductor lasers made according to this exemplary embodiment is the ability to "roll over" the laser a large number of times. As the input current to a semiconductor laser is increased, the output power will generally increase until it reaches a maximum, after which the laser output power quickly drops toward zero. When the laser is mounted upon an efficient heat sink material such as AlN or diamond and a rollover test is performed, devices typically fail catastrophically due to heating at the facet. The current state of the art does not, therefore, exhibit the ability to roll over a large number of times without suffering catastrophic damage.

Figure 3:
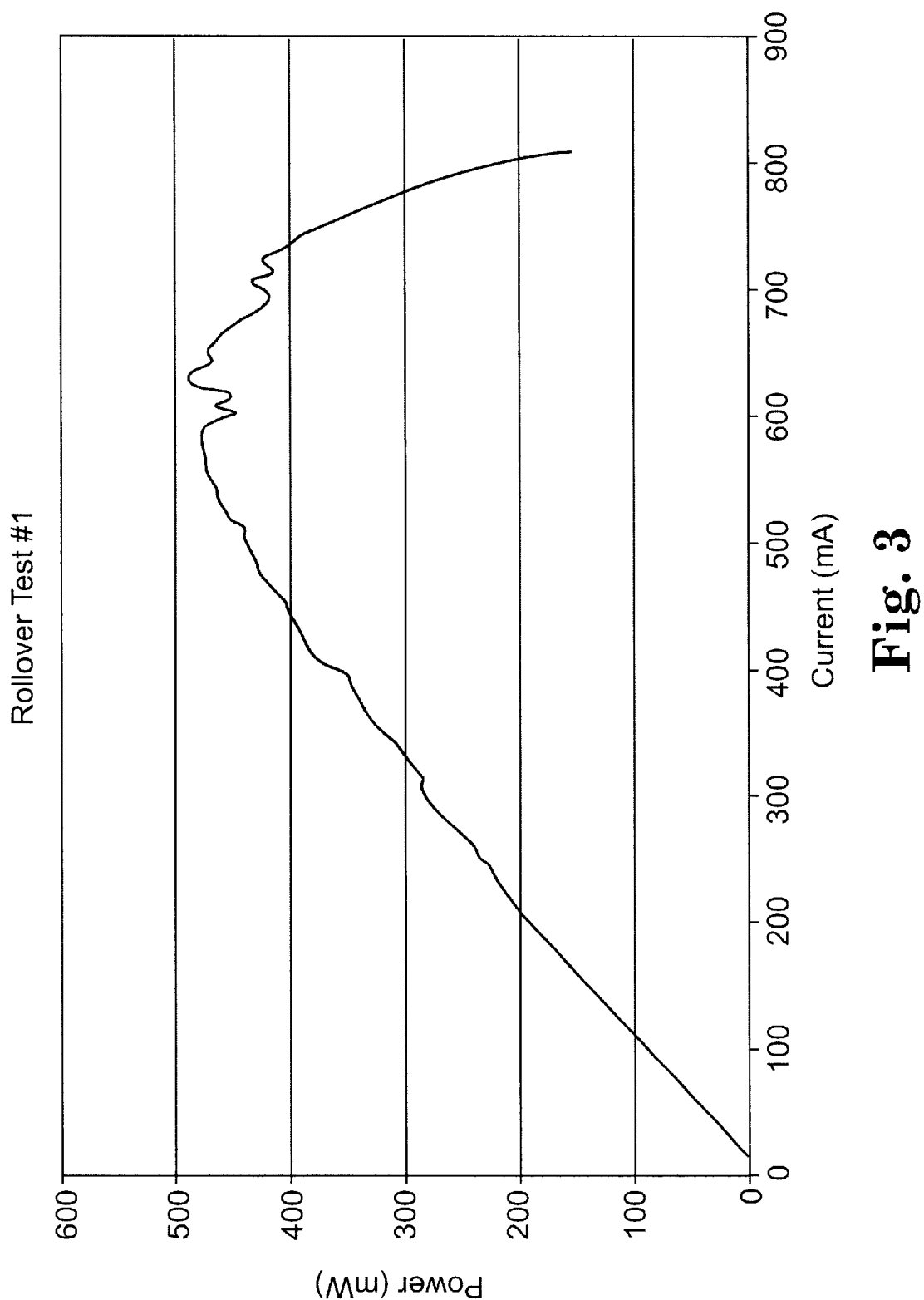
FIG. 3 shows a graph of input current versus output power for a semiconductor laser made according to a preferred embodiment of the invention.
Figure 4:
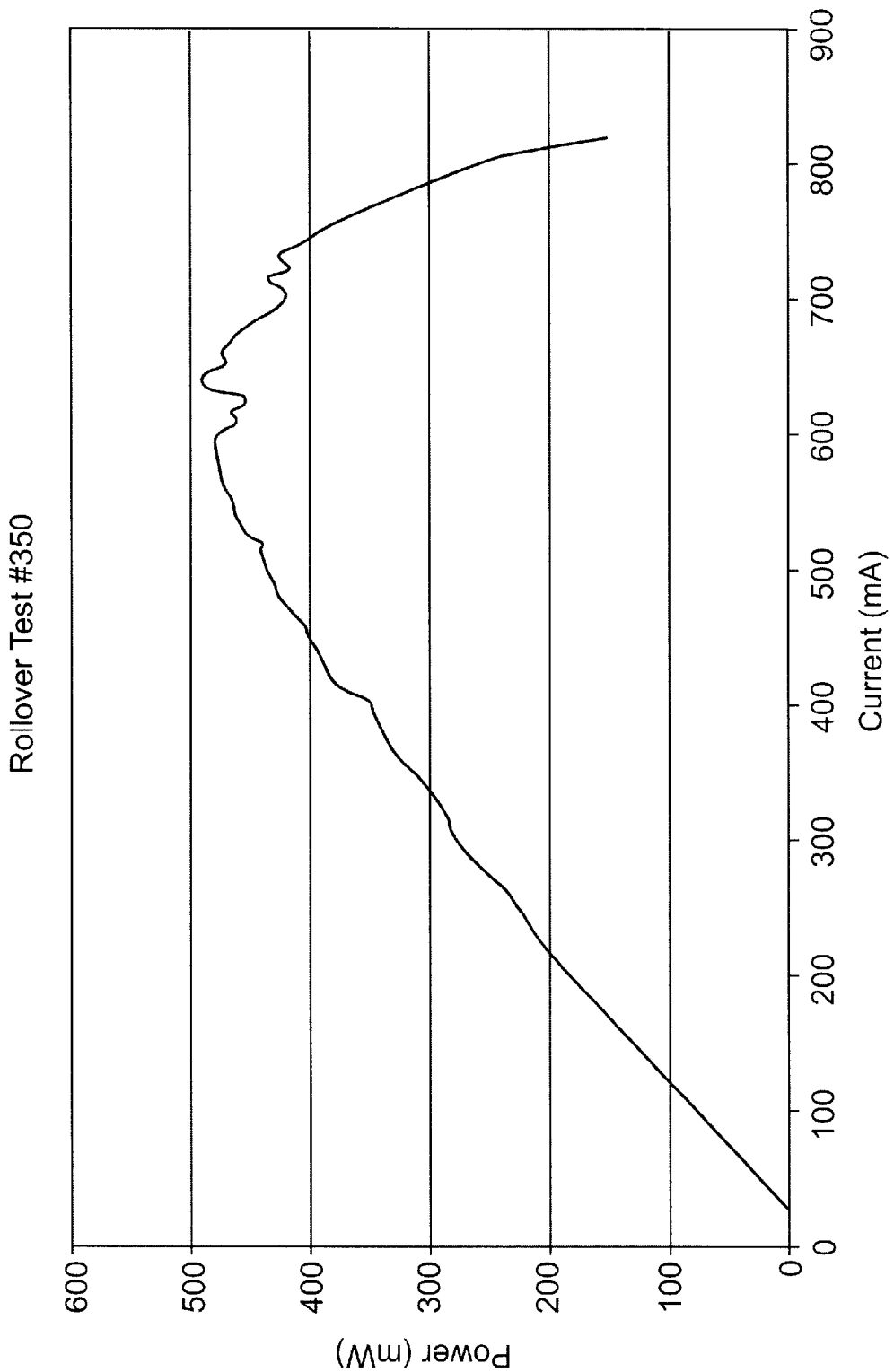
FIG. 4 shows a graph similar to FIG. 3, after the laser has been rolled over 350 times.

Lasers made according to the preferred embodiment of the present invention, in contrast, have exhibited an ability to be rolled over hundreds of times, with negligible effect on the power output of the laser. FIG. 3 shows a graph of power output versus input current for the laser described in the above example for initial power-up. As can be seen therein, the laser exhibited a maximum power output of over 450 mW, which is extremely high for a semiconductor laser. More surprisingly, Applicants have found that the semiconductor laser of this example can, be rolled over in excess of 350 times without suffering catastrophic damage. FIG. 4 shows the graph of power output vs. input current graph after 350 rollovers. As shown therein, not only is it possible to roll over the laser in excess of 350 times, but the power output curve after 350 rollovers is essentially indistinguishable from the initial power curve.

While particular embodiments of the invention have been discussed, it should be understood that this invention is not limited thereto as modifications may be made by those skilled in the art, particularly in light of the foregoing teachings. Accordingly, the appended claims contemplate coverage of any such modifications as incorporate the essential features of these improvements within the true spirit and scope of the invention.

We claim:

1. A semiconductor laser for producing laser light at a wavelength $\lambda$ comprising:
   a plurality of layers deposited on a substrate so as to define a waveguide, said waveguide having first and second opposing end surfaces, wherein the first end surface is a cleaved end surface having a contamination level of no greater than 10 atomic % contaminants; and
   a base mirror layer grown epitaxially as a single crystal layer on the first end surface, said base mirror layer being made of a material having a refractive index different from that of the multilayer structure and having a thickness to controllably modify the reflectivity of the first end surface to a predetermined reflectivity.

2. A semiconductor laser as claimed in claim 1, further comprising a second base mirror layer formed on the second end surface.

3. A semiconductor laser as claimed in claim 1, wherein said base mirror layer comprises ZnSe, MgS, or BeTe.

4. A semiconductor laser as claimed in claim 1, wherein said base mirror layer is between about 80–200 nm thick.

5. A semiconductor laser as claimed in claim 1, wherein a plurality of additional mirror layers are formed on said base mirror layer, said plurality of additional mirror layers being formed of a material different than said base mirror layer.

6. A semiconductor laser as claimed in claim 5, wherein said laser is designed to operate at a wavelength $\lambda$, and wherein said base mirror layer and said plurality of additional mirror layers are each about $\lambda/4n$ thick, n being the refractive index of the material making up the additional mirror layers.

7. A semiconductor laser as claimed in claim 6, wherein said base mirror layer comprises ZnSe, MgS, or BeTe.

8. A semiconductor laser as claimed in claim 5, wherein said plurality of additional mirror layers are applied as amorphous layers on said base mirror layer.

9. A semiconductor laser as claimed in claim 1, wherein no additional layers are applied over said base mirror layer, whereby said base mirror layer is exposed.

10. A semiconductor laser as claimed in claim 1, wherein said plurality of layers comprises GaAs and $Al_xGa_{1-x}As$ layers such that said laser operates at about 980 nm.

11. A semiconductor laser as claimed in claim 10, wherein said base mirror layer comprises ZnSe, MgS, or BeTe.

12. A semiconductor laser as claimed in claim 10, wherein said base mirror layer is between about 80–200 nm thick.

13. A semiconductor laser as claimed in claim 10, wherein said base mirror layer is about 100 nm thick.

14. A semiconductor laser as claimed in claim 1, wherein said base mirror layer is made of a material having a high band gap relative to the plurality of layers forming the waveguide.

15. A semiconductor laser comprising:
   a plurality of layers deposited on a substrate so as to define a waveguide, said waveguide having first and second opposing end surfaces, wherein the first end surface is a substantially contamination free cleaved end surface having a facet reflectivity, and wherein the waveguide has a predetermined waveguide reflectivity at the first end surface; and
   a base mirror layer grown epitaxially as a single crystal layer on the first end surface, said base mirror layer being made of a material having a refractive index different from that of the multilayer structure and having a sufficient thickness to controllably modify the facet reflectivity of the first end surface to achieve the predetermined waveguide reflectivity at the first end surface.

16. A semiconductor laser as claimed in claim 15, wherein said base mirror layer is about $\lambda/4n$ thick, where $\lambda$ is the operating wavelength of the laser, and n is the refractive index of the base mirror layer material.

17. A semiconductor laser as claimed in claim 15, wherein said base mirror layer is made of a material having a high band gap relative to the plurality of layers defining the waveguide.

18. A semiconductor laser as claimed in claim 15, further comprising a mirror stack formed on said second end surface wherein said mirror stack comprises a base mirror layer grown epitaxially as a substantially single crystal layer on said second opposing end surface, the base mirror layer of said mirror stack having sufficient thickness and being made of a material having a refractive index sufficiently different from that of the plurality of layers to substantially modify the reflectivity of the second end surface.

19. A semiconductor laser as claimed in claim 18, wherein said base mirror layers are each about $\lambda/4n$ thick, where $\lambda$ is the operating wavelength of the laser, and n is the refractive index of the base mirror layer material.

20. A semiconductor laser as claimed in claim 18, wherein the refractive index of said base mirror layers differs from that of the active layer by at least 50%.

21. A semiconductor laser as claimed in claim 18, wherein said base mirror layers are made of a material having a high band gap relative to the plurality of layers forming the waveguide.

22. A semiconductor laser as claimed in claim 18, wherein said plurality of layers comprises GaAs and AlGaAs layers such that the laser operates at about 980 nm, and wherein said base mirror layers comprises ZnSe, MgS, or BeTe.

23. A semiconductor laser as claimed in claim 18, wherein said second mirror stack further comprises a plurality of additional mirror layers formed over the base mirror layer.

24. A semiconductor laser as claimed in claim 24, wherein said additional mirror layers of the second mirror stack are grown epitaxially as a substantially single crystal layer over said base mirror layer.

25. A semiconductor laser as claimed in claim 24, wherein said plurality of layers comprises GaAs and AlGaAs layers such that the laser operates at about 980 nm, wherein said base mirror layers comprises ZnSe, and wherein said additional mirror layers of the second mirror stack comprise alternating layers of ZnSe and BeTe.

26. A semiconductor laser as claimed in claim 23, wherein said first mirror stack consists only of said base mirror layer.

27. A semiconductor laser as claimed in claim 23, wherein said additional mirror layers of the second mirror stack are made of amorphous material.

28. The semiconductor laser of claim 15, comprising at least one additional mirror layer grown epitaxially as a single crystal layer and formed over the base mirror layer.

29. The semiconductor laser of claim 28, comprising a plurality of additional layers provided over the base mirror layer, wherein at least one of the additional layers comprises a material that is different from the base mirror layer.

30. A semiconductor laser as claimed in claim 29, wherein said laser is designed to operate at a wavelength $\lambda$, and wherein said base mirror layer and said plurality of additional mirror layers are each about $\lambda/4n$ thick, n being the refractive index of the material making up the additional mirror layers.

31. A semiconductor laser as claimed in claim 15, wherein said base mirror layer comprises ZnSe, MgS, or BeTe.

32. A semiconductor laser as claimed in claim 15, wherein no additional layers are applied over said base mirror layer, whereby said base mirror layer is exposed.

33. A semiconductor laser as claimed in claim 15, wherein said plurality of layers comprises GaAs and $Al_xGa_{1-x}As$ layers such that said laser operates at about 980 nm.

34. The semiconductor laser of claim 15, wherein the substantially contamination-free first end surface has a contamination level of no greater than 10 atomic % contaminants.

35. A semiconductor laser for producing laser light at a wavelength $\lambda$ comprising:

a plurality of layers deposited on a substrate so as to define a waveguide, said waveguide having opposing end surfaces, at least one of which end surface is a substantially contamination-free cleaved end surface; and a base mirror layer grown epitaxially as a single crystal layer on the substantially contamination free cleaved end surface to a thickness not equal to $\lambda/4$ to controllably modify the reflectivity of the end surface to a predetermined reflectivity, said base mirror layer being made of a material having a refractive index different from that of the multilayer structure.

* * * * *

UNITED STATES PATENT AND TRADEMARK OFFICE
CERTIFICATE OF CORRECTION

PATENT NO. : 6,590,920 B1 Page 1 of 1
DATED : July 8, 2003
INVENTOR(S) : McElhinney et al.

It is certified that error appears in the above-identified patent and that said Letters Patent is hereby corrected as shown below:

<u>Column 8,</u>
Line 60, "24" should be -- 23 --.

Signed and Sealed this

Eighteenth Day of November, 2003

JAMES E. ROGAN
*Director of the United States Patent and Trademark Office*